US008435719B2

(12) United States Patent
Goldfarb

(10) Patent No.: US 8,435,719 B2
(45) Date of Patent: May 7, 2013

(54) TUNABLE CONTACT ANGLE PROCESS FOR IMMERSIONLITHOGRAPHY TOPCOATS AND PHOTORESISTS

(75) Inventor: Dario Leonardo Goldfarb, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/500,663

(22) Filed: Aug. 8, 2006

(65) Prior Publication Data

US 2008/0166667 A1 Jul. 10, 2008

(51) Int. Cl.
*G03F 7/26* (2006.01)
(52) U.S. Cl.
USPC ............... 430/273.1; 430/270.1; 430/330; 430/331
(58) Field of Classification Search ............ 430/270.1, 430/311, 273.1, 322
See application file for complete search history.

(56) References Cited

U.S. PATENT DOCUMENTS

| 3,949,121 | A | 4/1976 | Kenney |
| 5,474,717 | A | 12/1995 | Bucher et al. |
| 5,599,489 | A | 2/1997 | Saiki et al. |
| 6,395,331 | B1 | 5/2002 | Yan et al. |
| 6,692,832 | B2 | 2/2004 | Murphy |
| 6,743,516 | B2 | 6/2004 | Murphy et al. |
| 6,767,587 | B1 | 7/2004 | Brown |
| 6,821,908 | B1 | 11/2004 | Bansal et al. |
| 2002/0142621 | A1 | 10/2002 | Wang |
| 2004/0202872 | A1 | 10/2004 | Fang et al. |
| 2005/0042554 | A1* | 2/2005 | Dierichs et al. ............... 430/322 |
| 2005/0175776 | A1* | 8/2005 | Streefkerk et al. ............ 427/256 |
| 2005/0233254 | A1* | 10/2005 | Hatakeyama et al. ........ 430/311 |
| 2005/0277059 | A1* | 12/2005 | Kanda ........................ 430/270.1 |
| 2005/0286031 | A1* | 12/2005 | French et al. ................... 355/30 |
| 2006/0029884 | A1* | 2/2006 | Hatakeyama et al. ..... 430/270.1 |
| 2006/0154170 | A1* | 7/2006 | Endo et al. ................. 430/270.1 |
| 2006/0275706 | A1* | 12/2006 | Corliss et al. ................. 430/311 |
| 2006/0281028 | A1* | 12/2006 | Peng et al. .................... 430/311 |
| 2007/0019032 | A1* | 1/2007 | Maekawa et al. ............... 347/45 |

FOREIGN PATENT DOCUMENTS

WO WO 2004/088429 * 10/2004

* cited by examiner

*Primary Examiner* — Cynthia H Kelly
*Assistant Examiner* — Anca Eoff
(74) *Attorney, Agent, or Firm* — Theresa O'Rourke Nugent; Nugent & Smith, LLP

(57) ABSTRACT

A process for tuning the water contact angle of an immersion photoresist layer or immersion topcoat layer by modification of the top surface. The surface modification is a layer of fluorinated polymer.

18 Claims, 3 Drawing Sheets

Figure 1:
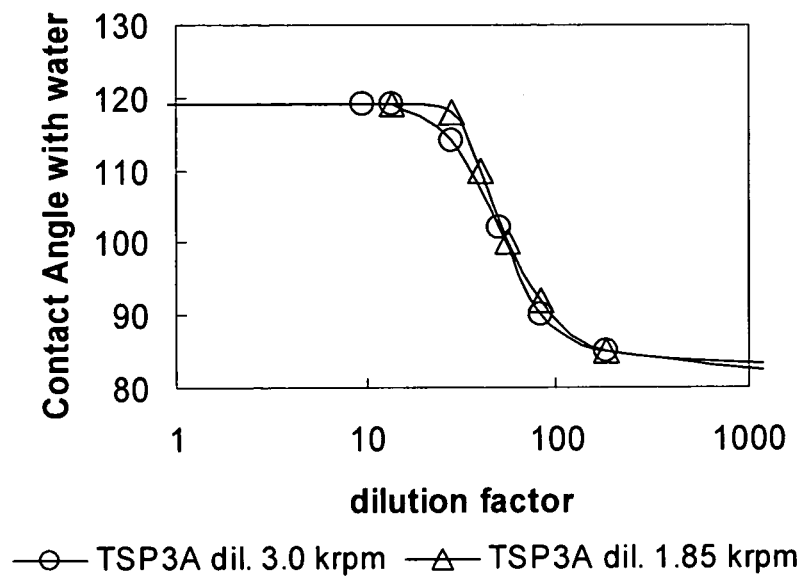
Figure 2:
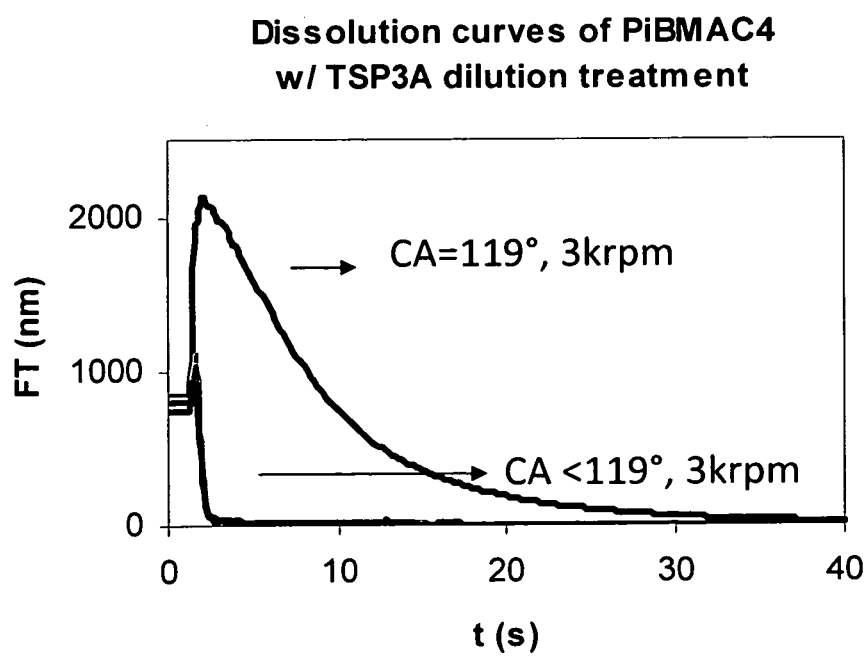
Figure 3:
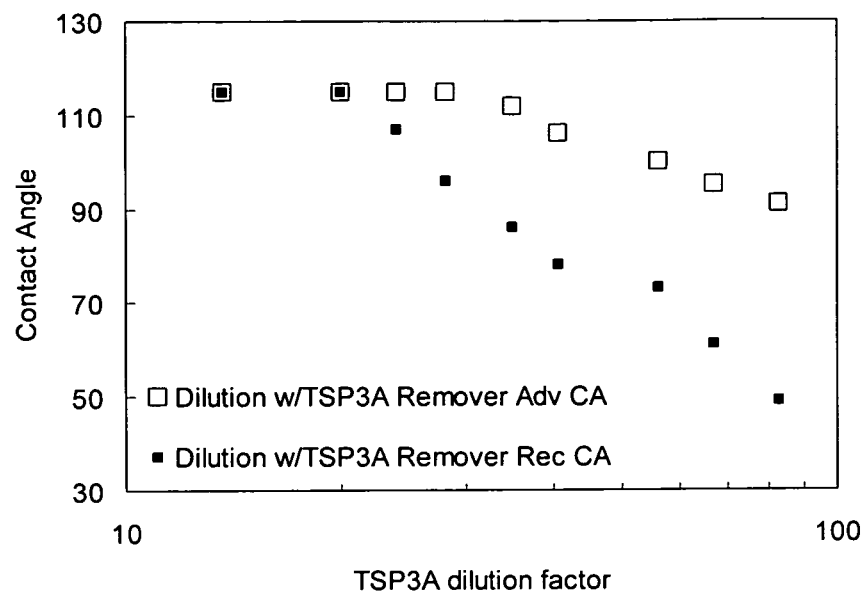

TUNABLE CONTACT ANGLE PROCESS FOR IMMERSION LITHOGRAPHY TOPCOATS AND PHOTORESISTS

FIELD OF THE INVENTION

The invention generally relates to immersion lithography for semiconductor fabrication and, more particularly, to a process for surface modification of a photoresist layer and/or topcoat.

BACKGROUND OF INVENTION

Lithography is used in semiconductor fabrication via radiation to transfer images onto a substrate coated with a material reactive to the radiation. Radiation in the form of light, for example, ultraviolet light, may be directed onto a mask (i.e., a photomask) defining a pattern. After shining through or reflecting from a mask the light is projected through a series of optical lenses and/or mirrors that shrink the image. The reduced image is then projected onto the workpiece. The workpiece may, for example, be silicon or other semiconductor wafer covered with a radiation-sensitive photoresist. As the projected light hits the photoresist on the silicon wafer, it may alter the unmasked photoresist. Unaltered photoresist may then be chemically washed away, leaving patterned photoresist on portions of the wafer.

Immersion lithography (IL) is emerging as the technique of choice to print sub-100 nm photoresist structures using 193 nm radiation for semiconductor manufacturing. For 193 nm exposure wavelength pure water meets all the requirements for optimal semiconductor fabrication producing an index of refraction n≈1.44 and absorption of <5% at working distances of up to 6 mm. Water can also be compatible with photoresist and photolithographic lenses and degassed and decontaminated for a high level of purity.

A number of practical issues to implementing immersion lithography exist. The general process requires filling the gap between the last lens element of the exposure tool and the resist-coated substrate with ultra pure water. One approach has been to wholly or partially submerge the wafer stage, wafer and lens in a pool of water. The pool may be a recirculating pool or a stagnant pool. An issue with this approach is that submerging significant portions of multi-million dollar equipment requires significant re-engineering.

Another technique is to dispense water between the lens and the wafer with a nozzle. A suction port for liquid recovery may receive supplied liquid. Continuously maintaining a bubble-free even layer of water between the moving lens and wafer can be quite difficult using this technique, and larger topographical discontinuities, such as workpiece edges, complicate the engineering.

Even where immersion lithography has been shown to be a somewhat effective and simple enhancement technique to extend the limits of optical lithography, the contact between the immersion fluid and the resist could potentially lead to partial resist image degradation. One major concern associated to the introduction of immersion lithography at the manufacturing level is achieving adequate defectivity and overlay control.

All practiced methods used to manage the immersion fluid during the exposure step cannot perfectly contain the water within the scanner showerhead, and residual liquid in the form of droplets are expected to be left behind as the wafer scanning proceeds. Evaporation of residual water droplets from the immersion fluid during exposure can lead to uncontrolled cooling of the wafer surface, therefore leading to spatial pattern registration errors between different printed layers, which detrimentally affect the overlay budget. Simultaneously, the residual liquid is known to increase the post-exposure and post-development defectivity levels due to extraction and subsequent concentration of topcoat and resist components and/or environmental contaminants within the droplets upon evaporation.

One of the factors that controls the amount and size of water droplets that are able to break away from the liquid pool and escape the fluid containment system is the wettability of the topcoat or photoresist surface. A topcoat or resist material with high surface energy (hydrophilic) will generate a low contact angle between the immersion fluid (water) and the top surface of the imaging material. However, such enhanced wettability of the topcoat or resist surface can lead to water meniscus breakdown and residual droplet formation during the showerhead scanning process.

Contrarily, a topcoat or resist material with low surface energy (hydrophobic) will generate a high contact angle between the immersion fluid (water) and the top surface of the imaging material. Under high contact angle conditions the water pool integrity is maintained by the surface tension force acting on the surface of the liquid, and therefore the water pool can be more efficiently contained.

While certain hydrophobic materials are know, such as non-polar polymers, they are quite thick in application (e.g. 30 nm and above) and thus require further processing steps. In addition, they are expensive in and of themselves, while again adding expense to the manufacture due to the necessary additional processing steps. For example, a polymer may be added to an alcohol based photoresist topcoat, but the topcoat must be specific and the polymer layer must be baked, followed by exposure, a post-exposure bake step, a removal step and finally the developer step. The polymer layer may typically be more than 30-60 nm.

Thus, there remains a need for a more economical material and/or streamlined process that can provide a high contact angle between the top imaging surface of the photoresist layer and water.

These needs and many others are met by a process for coating the top of a photoresist layer with a fluorinated polymer. Other advantages of the present invention will become apparent from the following description and appended claims.

SUMMARY OF THE INVENTION

The invention is a process for tuning a contact angle of a photoresist layer by applying an ultra thin fluorinated polymer layer onto the photoresist layer. The photoresist layer may further include a topcoat thereon.

Another embodiment of the invention includes a surface modification process for an immersion photoresist including coating a photoresist layer onto a substrate and applying an ultra thin fluorinated polymer onto the top of the photoresist layer. The photoresist layer may further include a topcoat thereon.

A further embodiment of the invention includes a surface modification process for an immersion photoresist including coating a photoresist layer onto a substrate, coating a conventional immersion topcoat, coating an ultra thin fluorinated polymer layer onto the top of the immersion topcoat layer, and rinsing.

An additional embodiment of the invention includes a process for manufacturing a structure including providing a substrate, coating a photoresist layer, baking, optionally applying a topcoat and baking the topcoat, applying an ultra thin fluorinated polymer layer, exposing and developing.

Other embodiments of the invention are disclosed herein.

DETAILED DESCRIPTION OF THE INVENTION

The invention is a surface modification process for immersion topcoats and/or photoresists that can precisely tune the contact angle between the top imaging surface and water within a wide range. The increase in contact angle leads to decreased defectivity levels and overlay errors associated to the immersion lithography process. Further, the process is streamlined and more economical in material cost as well as time and processing costs.

The general process for semiconductor fabrication includes coating or baking a layer of photoresist onto a silicon wafer. Optionally, a bottom organic antireflective coating (BARC) might be interposed between the silicon substrate and the photoresist layer. A topcoat may then be applied to the photoresist layer. Any topcoat suitable for immersion lithography may be used as known by those of ordinary skill in the art, including but not limited to alcohol based topcoats. The present invention expands the possible topcoats as the fluorinated polymer layer is not baked prior to exposure and developing. Thus, less expensive and even somewhat inferior topcoats may be used, as know in the art. Further, the topcoat may even be hydrophilic and have a low contact angle as the fluorinated polymer layer applied on top is hydrophobic and leads to a high contact angle.

The inventive process includes applying an ultra thin hydrophobic layer on top of the photoresist layer or immersion topcoat layer. The hydrophobic component consists on one or more fluorinated polymers. Suitable fluorinated polymers of the present invention include but are not limited to homopolymers or copolymers of poly(fluoroacrylates), poly(fluoromethacrylates), poly(fluorodioxolanes), poly(tetrafluoroethylenes), poly(tetrafluoroethylene oxides), and poly(difluoromethylene oxides) and combinations thereof. Further fluorinated polymers include but are not limited to, alone or in combination, Poly(2,2,3,4,4,4-hexafluorobutyl methacrylate), Poly(2,2,3,3,4,4,4-heptafluorobutyl methacrylate), Poly(2,2,3,3,3-pentafluoropropyl methacrylate), Poly(2,2,2-trifluoroethyl methacrylate), Poly(1,1,1,3,3,3-hexafluoroisopropyl methacrylate), Poly[4,5-difluoro-2,2-bis(trifluoromethyl)-1,3-dioxole-co-tetrafluoroethylene], Poly(tetrafluoroethylene oxide-co-difluoromethylene oxide) α,ω-diol bis(2,3-dihydroxypropyl ether), Poly(tetrafluoroethylene oxide-co-difluoromethylene oxide) α,ω-diol bis(2,3-dihydroxypropyl ether), all of which are available through Sigma-Aldrich. Experimental fluorinated polymers not commercially available include Poly(perfluoro-2-methylene-4-methyl-1,3-dioxolane (*Macromolecules,* 38 (2005) p. 4237-4245). Preferred fluorinated polymer formulations are TSP-3A (Tokyo Ohka Kogyo Co., Ltd.), or CYTOP® (Asahi Glass Co., Ltd) which consists on a formulation containing a fluorinated polymer (Poly(1,1,2,4,4,5,5,6,7,7-decafluoro-3-oxa-1,6-heptadiene), having an average molecular weight 60,000-70,000, in perfluorotributylamine.

The ultra thin hydrophobic layer may also be produced by combining a fluorinated polymeric resin with a fluorinated solvent. Suitable fluorinated polymeric resins include but are not limited to homopolymers or copolymers of poly(fluoroacrylates), poly(fluoromethacrylates), poly(fluorodioxolanes), poly(tetrafluoroethylenes), poly(tetrafluoroethylene oxides), and poly(difluoromethylene oxides), and combinations thereof. The fluorinated solvents include but are not limited to perfluorotributylamine (available from Sigma-Aldrich and from 3M as FC-43), perfluoro-2-butyltetrahydrofuran (available from Sigma-Aldrich and from 3M as FC-75), and mixtures of perfluorohydrocarbons, such as Fluorinert™ Fluid FC-77 (available from Sigma-Aldrich and from 3M) and combinations thereof.

The fluorinated polymer or formulation is diluted before being applied onto the photoresist layer or topcoat layer. Suitable diluters will not be too volatile and not to thick. The diluter may have a boiling point from about 80° C. to about 200° C. As the fluorinated polymer or formulation layer is not baked or removed before exposure, it should have transparency to imaging radiation. Suitable diluters include but are not limited to perfluorotributylamine (available from Sigma-Aldrich and from 3M as FC-43), perfluoro-2-butyltetrahydrofuran (available from Sigma-Aldrich and from 3M as FC-75) and mixtures of perfluorohydrocarbons, such as Fluorinert™ Fluid FC-77 (available from Sigma-Aldrich and from 3M). Preferred diluters are perfluoro-2-butyltetrahydrofuran (FC-75 manufactured by 3M of Minneapolis, Minn.) and perfluorotributylamine (FC-43 manufactured by 3M of Minneapolis, Minn.). The diluter may be added from about 10 parts to about 40 parts diluter per part fluorinated polymer or formulation.

The fluorinated polymer layer is deposited on the photoresist layer or topcoat layer in thickness of about 1 to about 5 nm. The preferred thickness is less than about 2 nm.

The fluorinated polymer layer is applied through known coating and deposition techniques, including but not limited to spin coating and dip coating.

While not being bound by theory, the contact angle tunability is achieved by controlling the film thickness of the applied ultra thin layer, which is attained through proper dilution of the fluorinated polymer and/or fluorinated polymeric resin with a fluorinated solvent and proper selection of the spin speed when using a spin coating process.

The advantages of the present invention include a wide range of contact angles that spans from that of the original top surface material (either an immersion photoresist or immersion topcoat, contact angle 60°-70°) to contact angle 118°. The high contact angle values attainable are not affected by the advancing or receding nature of the meniscus at the substrate-liquid-air interface. The receding angle is important in immersion lithography and the present invention can substantially increase the receding contact angle.

The contact angle may be finely tuned based on dilution of the fluorinated polymer layer and spin speed. Moreover, the contact angle values are uniform across entire wafer.

In addition, the ultra thin fluorinated polymeric layer is optically transparent and does not affect the exposure conditions of the imaging layer. Further, the volume of the fluorinated polymeric resin with a fluorinated solvent which is applied onto the substrate is very low, due to low surface tension of the fluorinated formulation.

Other advantages of the present invention include a streamlined process wherein there is no need to post-apply bake the deposited ultra thin fluorinated layer due to the dilution of the formulation used to tune the contact angle. Further, there is no need to remove the fluorinated layer after exposure and before the development step. Moreover, the amount of residual fluorinated casting solvent remaining in the film is extremely low due to its volatility.

As the deposited hydrophobic layer is ultra thin, a standard developer solution can easily permeate through this barrier. Therefore the topcoat layer remains soluble in standard developer solution, such as 0.26N tetramethyl ammonium hydroxide (TMAH). Again, there is no need to use any additional strip or removal process previous to the development step.

The process and structure of the present invention is further illustrated by the following non-limiting examples in which all parts and percentages are by weight, unless otherwise indicated.

Examples 1-8

A substrate was coated with a photoresist layer and a standard immersion topcoat material. A fluorinated polymer layer was applied to the top of the standard immersion topcoat material layer via spin coating. The fluorinated polymer was TSP3A, which was diluted by perfluoro-2-butyltetrahydrofuran in various dilution percentages as set forth in Table 1 below. Further, for the examples the spin speed combinations were varied as set forth in Table 1 below. Advancing contact angle values of the fluorinated polymer layer were determined as well as solubility in TMAH and are included in Table 1 below.

TABLE 1

| | Dilution (diluter(g)/ fluorinated polymer or formulation(g)) | Spin speed (krpm) | Advancing contact angle | Soluble in TMAH |
|---|---|---|---|---|
| Example 1 | 1:10 | 3 | 119 | No |
| Example 2 | 1:14 | 3 | 119 | Slow-Yes |
| Example 3 | 1:28 | 1.85 | 118 | Yes |
| Example 4 | 1:41 | 1.85 | 110 | Yes |
| Example 5 | 1:50 | 1.85 | 100 | Yes |
| Example 6 | 1:83 | 1.85 | 92 | Yes |
| Example 7 | 1:183 | 1.85 | 85 | Yes |
| Example 8 | 1:1000 | 1.85 | 82 | Yes |

FIG. 1 is a representation of Table 1 above wherein the x-axis is various dilution factors and the y-axis is the contact angle with water for the formed ultra thin hydrophobic layer.

It was also observed that for contact angles below 119°, the dissolution rate of the fluorinated polymer layer in a standard developer is not affected by the presence of the fluorinated polymer layer. Chart 2 below includes the results observed from Example 2 (dilution 1:14) and Example 3 (dilution 1:28).

Examples 9-17

A substrate was coated with a photoresist layer and a standard immersion topcoat material. A fluorinated polymer layer was applied to the top of a standard immersion topcoat material layer via spin coating at 1.85 krpm. The fluorinated polymer was TSP3A which was diluted by perfluoro-2-butyltetrahydrofuran in various dilution percentages as set forth in Table 2 below. Advancing and receding contact angle values of the fluorinated polymer layer were determined and are included in Table 2 below.

TABLE 2

| | Dilution | Advancing Contact Angle | Receding contact angle |
|---|---|---|---|
| Example 9 | 1:14 | 115 | 115 |
| Example 10 | 20 | 115 | 115 |
| Example 11 | 24 | 115 | 107 |
| Example 12 | 28 | 115 | 96 |
| Example 13 | 35 | 112 | 86 |
| Example 14 | 43 | 106 | 78 |
| Example 15 | 50 | 100 | 73 |
| Example 16 | 67 | 95 | 61 |
| Example 17 | 83 | 91 | 49 |

TABLE 2-continued

| | Dilution | Advancing Contact Angle | Receding contact angle |
|---|---|---|---|
| Standard-neat immersion topcoat surface (PNBHFA) | | 70 | 65 |
| Standard-neat immersion topcoat surface (PMVEMA4Me2Pe) | | 65 | 45-25 |

F*ig*. 3 is a representation of advancing and receding contact angles for neat immersion surfaces.

Examples 18-31

A substrate was coated with a photoresist layer and a standard immersion topcoat material. A fluorinated polymer layer was applied to the top of a standard immersion topcoat material layer via spin coating at 1.85 krpm. The fluorinated polymer was CYTOP® (a formulation containing a fluorinated polymer (Poly(1,1,2,4,4,5,5,6,7,7-decafluoro-3-oxa-1,6-heptadiene) in perfluorotributylamine) which was diluted by a perfluorohydrocarbon (Fluorinert™ Fluid FC-77) in various dilution percentages as set forth in Table 3 below. Advancing and receding contact angle values of the fluorinated polymer layer were determined and are included in Table 3 below.

TABLE 3

| | Dilution | Advancing Contact Angle |
|---|---|---|
| Example 18 | 1 | 118 |
| Example 19 | 0.5 | 118 |
| Example 20 | 0.2 | 117 |
| Example 21 | 0.15 | 117 |
| Example 22 | 0.125 | 117 |
| Example 23 | 0.12 | 117 |
| Example 24 | 0.115 | 117 |
| Example 25 | 0.11 | 103 |
| Example 26 | 0.1 | 100 |
| Example 27 | 0.1 | 100 |
| Example 28 | 0.05 | 94 |
| Example 29 | 0.01 | 90 |
| Example 30 | 0.001 | 90 |
| Example 31 | 0.0001 | 90 |

Figure 4:
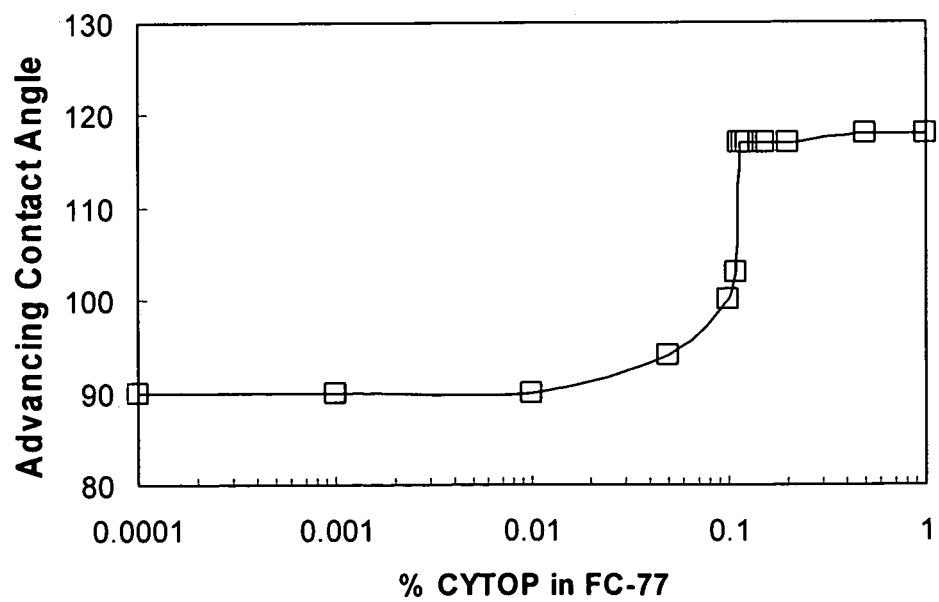

FIG. 4 is a representation of Table 3 above wherein the x-axis is various dilution factors and the y-axis is the contact angle with water for the formed ultra thin hydrophobic layer.

Examples 33-38

A substrate was coated with a photoresist layer and a standard immersion topcoat material. A fluorinated polymer layer was applied to the top of a standard immersion topcoat material layer via spin coating at 1.85 krpm. The fluorinated polymer was TSP3A which was diluted. In Examples 33-38 the diluter was perfluorotributylamine (FC 43) and in Examples 39-47 the diluter was perfluoro-2-butyltetrahydrofuran (FC 75), used in various dilution percentages as set forth in Table 4 below. Advancing and receding contact angle values of the fluorinated polymer layer were determined and are included in Table 4 below.

TABLE 4

|  | Dilution Rate (g/g) | Advancing Contact Angle | Receding Contact Angle |
|---|---|---|---|
| Example 33 | 0.0 | 118 | 118 |
| Example 34 | 5.7 | 118 | 110 |
| Example 35 | 8.4 | 117 | 110 |
| Example 36 | 12.3 | 113 | 80 |
| Example 37 | 19.0 | 103 | 70 |
| Example 38 | 41.4 | 88 | 36 |

Figure 5:
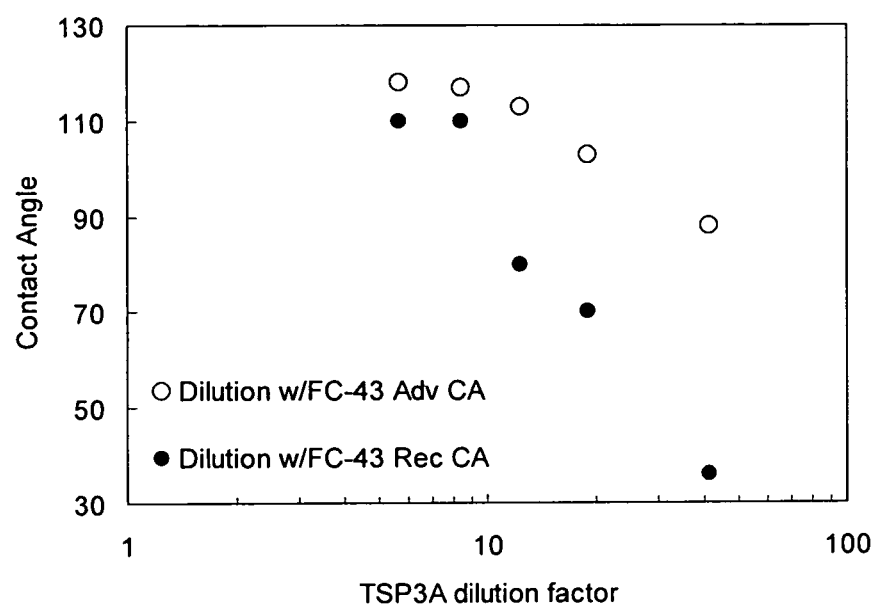

FIG. 5 is a representation of Table 4 above wherein the x-axis is various dilution factors and the y-axis is the contact angle with water for the formed ultra thin hydrophobic layer.

The invention has been described in terms of preferred embodiments thereof, but is more broadly applicable as will be understood by those skilled in the art. The scope of the invention is only limited by the following claims.

I claim:

1. A surface modification process for an immersion photoresist comprising:
   a) coating a photoresist layer onto a substrate;
   b) applying a topcoat layer onto the photoresist layer; and
   c) applying a fluorinated polymer onto the topcoat layer on the photoresist layer, wherein the fluorinated polymer layer is less than about 5 nm and the fluorinated polymer is (Poly(1,1,2,4,4,5,5,6,7,7-decafluoro-3-oxa-1,6-heptadiene).

2. The surface modification process of claim 1 wherein the fluorinated polymer layer further comprises a fluorinated solvent.

3. The surface modification process of claim 2 wherein the fluorinated solvent is selected from the group consisting of perfluorotributylamine, perfluoro-2-butyltetrahydrofuran, mixtures of perfluorohydrocarbons and combinations thereof.

4. The surface modification process of claim 1 further comprising the step of diluting the fluorinated polymer before deposition.

5. The surface modification process of claim 4 wherein the fluorinated polymer is diluted with a fluorinated organic solvent.

6. The surface modification process of claim 5 wherein the fluorinated organic solvent is selected from the group consisting of perfluorotributylamine, perfluoro-2-butyltetrahydrofuran, mixtures of perfluorohydrocarbons and combinations thereof.

7. The surface modification process of claim 5 wherein the fluorinated organic solvent is perfluoro-2-butyltetrahydrofuran.

8. The surface modification process of claim 5 wherein the fluorinated organic solvent is perfluorotributylamine.

9. A radiation-sensitive multi-layer structure comprising:
   a) a substrate;
   b) a photoresist layer on top of the substrate;
   c) a topcoat layer on top of the photoresist layer; and
   d) a fluorinated polymer layer on top of the topcoat layer, wherein the fluorinated polymer layer is less than about 5 nm and the fluorinated polymer is comprised of (Poly (1,1,2,4,4,5,5,6,7,7-decafluoro-3-oxa-1,6-heptadiene) and perfluorotributylamine.

10. A process for tuning a contact angle of a photoresist layer comprising:
    a) providing a substrate;
    b) applying a photoresist layer onto the substrate;
    c) applying a topcoat layer onto the photoresist layer; and
    d) applying a fluorinated polymer onto the topcoat layer on the photoresist layer in order to tune the contact angle of the top surface of the photoresist layer and wherein the fluorinated polymer layer is less than about 5 nm and the fluorinated polymer is (Poly(1,1,2,4,4,5,5,6,7,7-decafluoro-3-oxa-1,6-heptadiene).

11. The tuning process of claim 10 wherein the contact angle is from about 60 to about 120 degrees.

12. The tuning process of claim 10 wherein the fluorinated polymer layer further comprises a fluorinated solvent.

13. The tuning process of claim 12 wherein the fluorinated solvent is selected from the group consisting of perfluorotributylamine, perfluoro-2-butyltetrahydrofuran, mixtures of perfluorohydrocarbons, and combinations thereof.

14. The tuning process of claim 10 further comprising the step of diluting the fluorinated polymer before application.

15. The tuning process of claim 14 wherein the diluter is selected from the group consisting of perfluorotributylamine, perfluoro-2-butyltetrahydrofuran, mixtures of perfluorohydrocarbons, and combinations thereof.

16. The tuning process of claim 14 wherein the diluter is perfluorotributylamine.

17. The tuning process of claim 14 wherein the diluter is perfluoro-2-butyltetrahydrofuran.

18. A process for manufacturing a radiation-sensitive multi-layer structure comprising:
    a) providing a substrate;
    b) applying a photoresist layer;
    c) baking the photoresist layer;
    d) optionally applying a topcoat layer and baking the topcoat layer;
    e) applying a fluorinated polymer layer, which is less, than about 5 nm and the fluorinated polymer is (Poly(1,1,2,4,4,5,5,6,7-decafluoro-3-oxa-1,6-heptadiene);
    f) exposing the fluorinated layer to radiation;
    g) baking the radiation-sensitive multi-layer structure;
    h) developing the radiation-sensitive multi-layer structure; and
    i) rinsing the radiation-sensitive multi-layer structure.

* * * * *